US011509319B2

United States Patent
Li et al.

(10) Patent No.: US 11,509,319 B2
(45) Date of Patent: Nov. 22, 2022

(54) LOW INTEGRAL NON-LINEARITY DIGITAL-TO-TIME CONVERTER FOR FRACTIONAL-N PLLS

(71) Applicant: Cisco Technology, Inc., San Jose, CA (US)

(72) Inventors: Yongxin Li, Champaign, IL (US); Romesh Kumar Nandwana, Breinigsville, PA (US); Kadaba Lakshmikumar, Basking Ridge, NJ (US)

(73) Assignee: Cisco Technology, Inc., San Jose, CA (US)

( * ) Notice: Subject to any disclaimer, the term of this patent is extended or adjusted under 35 U.S.C. 154(b) by 5 days.

(21) Appl. No.: 17/115,570

(22) Filed: Dec. 8, 2020

(65) Prior Publication Data

US 2022/0182064 A1  Jun. 9, 2022

(51) Int. Cl.
  *H03M 1/06*   (2006.01)
  *H03L 7/081*  (2006.01)
  *H03L 7/197*  (2006.01)

(52) U.S. Cl.
  CPC .......... *H03M 1/0604* (2013.01); *H03L 7/081* (2013.01); *H03L 7/197* (2013.01)

(58) Field of Classification Search
  CPC ....... H03M 1/0604; H03L 7/081; H03L 7/197
  See application file for complete search history.

(56) References Cited

U.S. PATENT DOCUMENTS

| | | | |
|---|---|---|---|
| 9,520,890 B1* | 12/2016 | Ben-Bassat | H03M 1/1014 |
| 9,941,898 B1* | 4/2018 | Banin | H03M 1/82 |
| 10,122,378 B2* | 11/2018 | Kim | H03M 1/68 |
| 10,320,401 B2* | 6/2019 | Ximenes | H03L 7/085 |
| 10,530,368 B1* | 1/2020 | Caffee | H03K 23/66 |
| 2007/0222493 A1* | 9/2007 | Afentakis | H03K 5/133 |
| | | | 327/276 |
| 2015/0088583 A1 | 3/2015 | Sayre et al. | |
| 2015/0188583 A1 | 7/2015 | Ravi et al. | |
| 2018/0205370 A1 | 7/2018 | Jin et al. | |
| 2018/0337683 A1 | 11/2018 | Mateman | |
| 2019/0212703 A1 | 7/2019 | Yao et al. | |

OTHER PUBLICATIONS

J. Z. Ru, C. Palattella, P. Geraedts, E. Klumperink, and B. Nauta, "A High-Linearity Digital-to-Time Converter Technique: Constant-Slope Charging," IEEE Journal of Solid-State Circuits, vol. 50, No. 6, Art. No. 6, Jun. 2015.

(Continued)

*Primary Examiner* — Khai M Nguyen
(74) *Attorney, Agent, or Firm* — Patterson + Sheridan, LLP (57) ABSTRACT

An apparatus includes a first digital-to-time converter (DTC) and a second DTC. The first DTC includes a sequence of delay stages. Each of the delay stages adds a delay to an input signal based on a control signal. Each delay stage includes a comparator and a capacitor coupled to an input of the comparator and to ground. The second DTC is coupled in parallel to the first DTC. The second DTC adds a delay to the input signal based on a complement of the control signal.

20 Claims, 4 Drawing Sheets

(56) References Cited

OTHER PUBLICATIONS

A. Elmallah, M. G. Ahmed, A. Elkholy, W.-S. Choi, and P. K. Hanumolu, "A 1.6ps peak-INL 5.3ns range two-step digital-to-time converter in 65nm CMOS," in 2018 IEEE Custom Integrated Circuits Conference (CICC), Apr. 2018, pp. 1-4.
H. Liu et al., "A 0.98mW fractional-N ADPLL using 10b isolated constant-slope DTC with FOM of ?246dB for IoT applications in 65nm CMOS," in 2018 IEEE International Solid—State Circuits Conference—(ISSCC), Feb. 2018, pp. 246-248.
W. Wu et al., "A 28-nm 75-fsrms Analog Fractional-N Sampling PLL With a Highly Linear DTC Incorporating Background DTC Gain Calibration and Reference Clock Duty Cycle Correction," IEEE Journal of Solid-State Circuits, vol. 54, No. 5, Art. No. 5, May 2019.
R. K. Nandwana et al., "A 3-to-10Gb/s 5.75pJ/b transceiver with flexible clocking in 65nm CMOS," in 2017 IEEE International Solid-State Circuits Conference (ISSCC), Feb. 2017, pp. 492-493.
P. Chen et al., "An On-Chip Self-Characterization of a Digital-to-Time Converter by Embedding it in a First-Order ?? Loop," IEEE Transactions on Circuits and Systems I: Regular Papers, 65(11), dated Nov. 2018, pp. 3734-3744. https://doi.org/10.1109/TCSI.20i8.2857999.

\* cited by examiner

LOW INTEGRAL NON-LINEARITY DIGITAL-TO-TIME CONVERTER FOR FRACTIONAL-N PLLS

TECHNICAL FIELD

Embodiments presented in this disclosure generally relate to signal generation circuits (e.g., clock generation circuits). More specifically, embodiments disclosed herein relate to using a digital-to-time converter (DTC) circuit in signal generation circuits.

BACKGROUND

In a conventional fractional-N clock multiplier, the divider circuit introduces undesired deterministic jitter. A digital-to-time converter (DTC) can be used to cancel the deterministic jitter in the output, but due to circuit imperfections, the DTC can exhibit non-linear behavior, which can be characterized using integral non-linearity (INL). Higher INL causes higher jitter and spurs in the output signal.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

In one embodiment, an apparatus includes a digital-to-time converter (DTC) and a second DTC. The first DTC includes a sequence of delay stages. Each of the delay stages adds a delay to an input signal based on a control signal. Each delay stage includes a comparator and a capacitor coupled to an input of the comparator and to ground. The second DTC is connected in parallel to the first DTC. The second DTC adds a delay to the input signal based on a complement of the control signal.

Example Embodiments

This disclosure describes a digital-to-time converter (DTC) circuit that adjusts the propagation delays of the output of a divider circuit using digital control words to cancel some of the jitter in the output. The DTC circuit includes two DTCs, a main DTC and a complementary DTC. The main DTC adds a delay to an input signal based on a control signal by sending the signal through a sequence of delay stages. In one embodiment, the delay stages include a capacitively loaded driver with a fixed capacitance coupled between buffers and a comparator of the main DTC. The fixed capacitance reduces the impact of a non-linear gate capacitance of the comparator, which improves integral non-linearity (INL) of the DTC circuit, in certain embodiments. The complementary DTC is coupled in parallel to the main DTC and adds a delay to the input signal based on a control signal that is the complement of the control signal used by the main DTC. In this manner, the total current load of the two DTCs is held constant across different codes. Additionally, the supply of the DTC circuit may be regulated by a low-dropout regulator so that the resolution of the circuit is immune to process, voltage and temperature variations. As a result of the fixed capacitance, the total current load being held constant, and the regulated supply, the DTC circuit can provide highly linear performance that is more resilient to process, voltage, and temperature variations, in certain embodiments.

Figure 1:
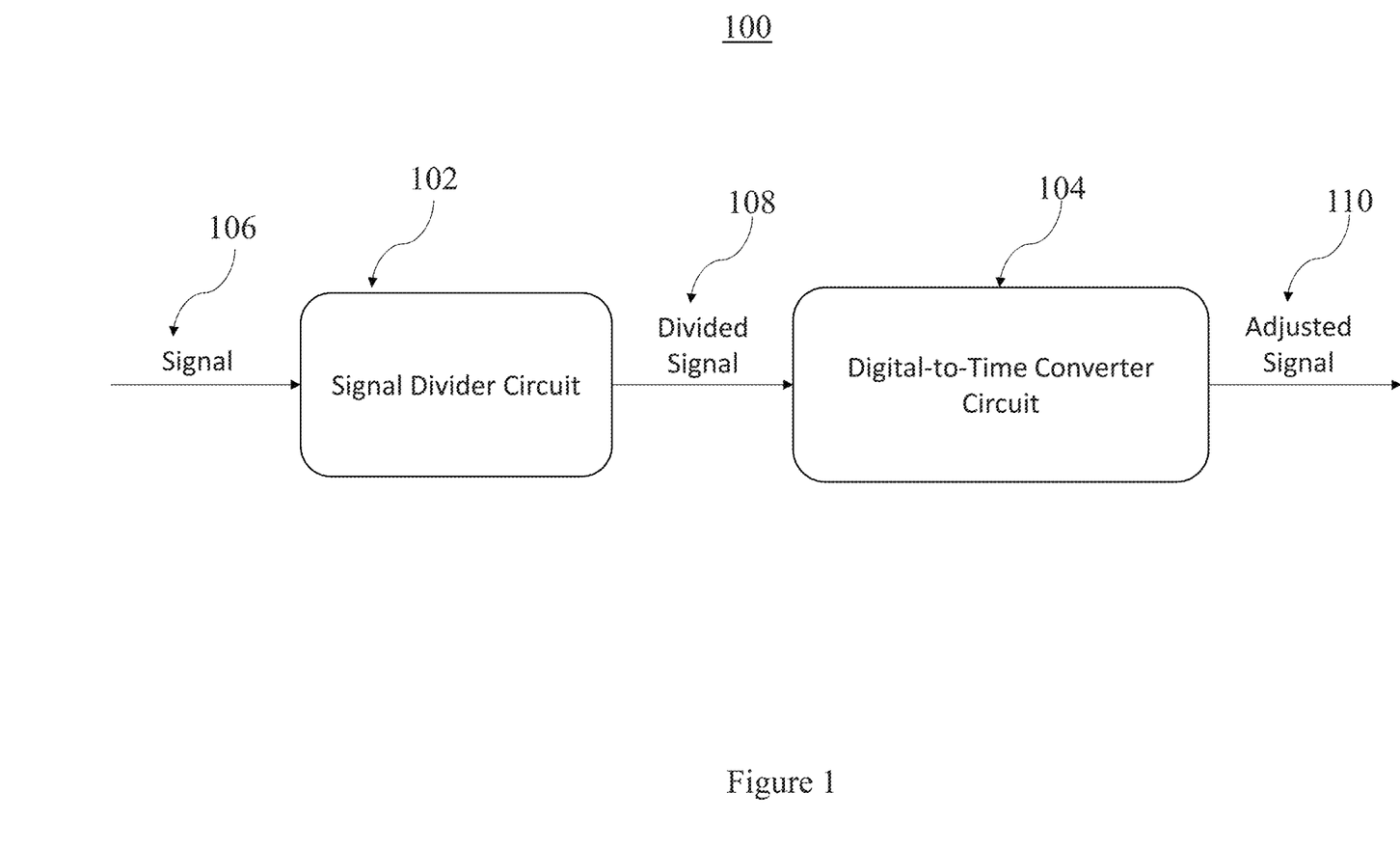
FIG. 1 illustrates an example circuit.

FIG. 1 illustrates an example circuit 100. As seen in FIG. 1, the circuit 100 includes a signal divider circuit 102 and a digital-to-time converter (DTC) circuit 104. Generally, the circuit 100 generates signals with frequencies that are fractionally divided from the frequency of an input signal. For example, the circuit 100 may be a clock generation circuit that uses a signal with a particular frequency to generate one or more clock signals of different frequencies. In particular embodiments, the circuit 100 adjusts the frequency of an input signal while reducing jitter in the signal.

The signal divider circuit 102 receives a signal 106 with a particular frequency. For example, the signal 106 may be a high frequency signal generated by an oscillator (e.g., a fixed frequency crystal reference oscillator, a phase-locked loop, an injection locked oscillator, or a multiplying delay locked loop). The signal divider circuit 102 may adjust the frequency of the signal 106 by a fractional multiple to produce one or more divided signals 108. For example, the signal divider circuit 102 may generate a divided signal 108 that has a frequency that is lower than the frequency of the signal 106 by a fractional multiple. The signal divider circuit 102 may generate any suitable number of divided signals 108 of different frequencies.

The signal divider circuit 102 may generate a divided signal 108 of a particular frequency by performing any suitable operation on the signal 106. For example, the signal divider circuit 102 may contain circuitry that switches an output signal from low to high or high to low on rising edges of the signal 106 to generate a divided signal 108. As a result, the divided signal 108 has a frequency that is half of the frequency of the signal 106. As another example, the signal divider circuit 102 may switch the output signal from low to high or high to low after a variable number of rising edges of the signal 106 (e.g., switch on two rising edges then switch on a third rising edge for two periods) which averages over time to a divided signal 108 with a particular frequency. The variable number of rising edges may be adjusted in any suitable manner to generate a divided signal 108 of any desired frequency.

As discussed previously, when the signal divider circuit 102 adjusts the frequency of the signal 106, the resulting divided signal 108 may include undesired jitter. For example, the signal divider circuit 102 may adjust the frequency of the signal 106 by a fractional multiple and long-term averaging, but this process may introduce instantaneous frequency error. This frequency error may cause deterministic jitter in the divided signal 108. This jitter may cause the frequency of the divided signal 108 to vary slightly over time. For example, certain portions of the divided signal 108 may have higher frequency but other portions of the divided signal 108 may have a lower frequency.

Conventional circuits may include a DTC after the signal divider circuit 102 to reduce the jitter in the divided signal 108. The DTC may add delay into the divided signal 108 to cancel some of the instantaneous frequency error. Although the DTC may cancel some of the jitter in the divided signal 108, the DTC may also cause the divided signal 108 to exhibit non-linear behavior characterized using integral non-linearity (INL). For example, circuit imperfections in the DTC may cause the resulting signal to exhibit non-linear behavior. This INL may cause additional jitter in the resulting signal. Thus, in certain instances, the DTC may add jitter.

The DTC circuit 104 adds delay to the divided signal 108 to produce an adjusted signal 110. Generally, the DTC circuit 104 includes one or more enhancements that add delay to the divided signal 108 while reducing jitter. For example, the DTC circuit 104 may include a capacitor coupled between ground and the comparator in each delay stage of the DTC. This capacitor may reduce the impact of a non-linear gate capacitance of the comparator, which improves the INL of the DTC circuit 104 in certain embodiments. As another example, the DTC circuit 104 includes a second DTC that is controlled based on the complement of a control signal used to control the first DTC. The two DTCs are connected in parallel. As a result, the total current load of the two DTCs is held substantially constant. Additionally, a supply in the DTC circuit 104 may be controlled by a programmable digital control signal that varies based on process, voltage, and temperature (PVT) variations in the first DTC. As a result of the total current load being held substantially constant and the programmable digital control signal, the DTC circuit 104 has higher linearity performance that is more resilient to PVT variations, in certain embodiments. The DTC circuit 104 thus adds delay to the divided signal 108 to produce an adjusted signal 110 while reducing jitter in the divided signal 108. The DTC circuit 104 will be described in more detail using FIGS. 2 through 4.

In particular embodiments, the DTC circuit 104 improves the INL performance of the circuit 100 by 2.2×. This improvement in the INL performance reduces the amount of jitter in the adjusted signal 110.

In some embodiments, the second DTC also improves the INL performance of the circuit 100. Without the second DTC present in the circuit 100, when the control signal to the DTC circuit 104 changes, the current consumption of the DTC circuit 104 also changes. This change in the current consumption of the DTC circuit 104 creates a ripple in the power supply voltage, which changes the behavior of the DTC circuit 104 dynamically and degrades the INL performance. By adding the second DTC to the DTC circuit 104, the current consumption of the DTC circuit 104 is held constant regardless of variations in the control signal. As a result, the ripples in the power supply voltage are avoided, which improves the INL performance of the DTC circuit 104.

Figure 2:
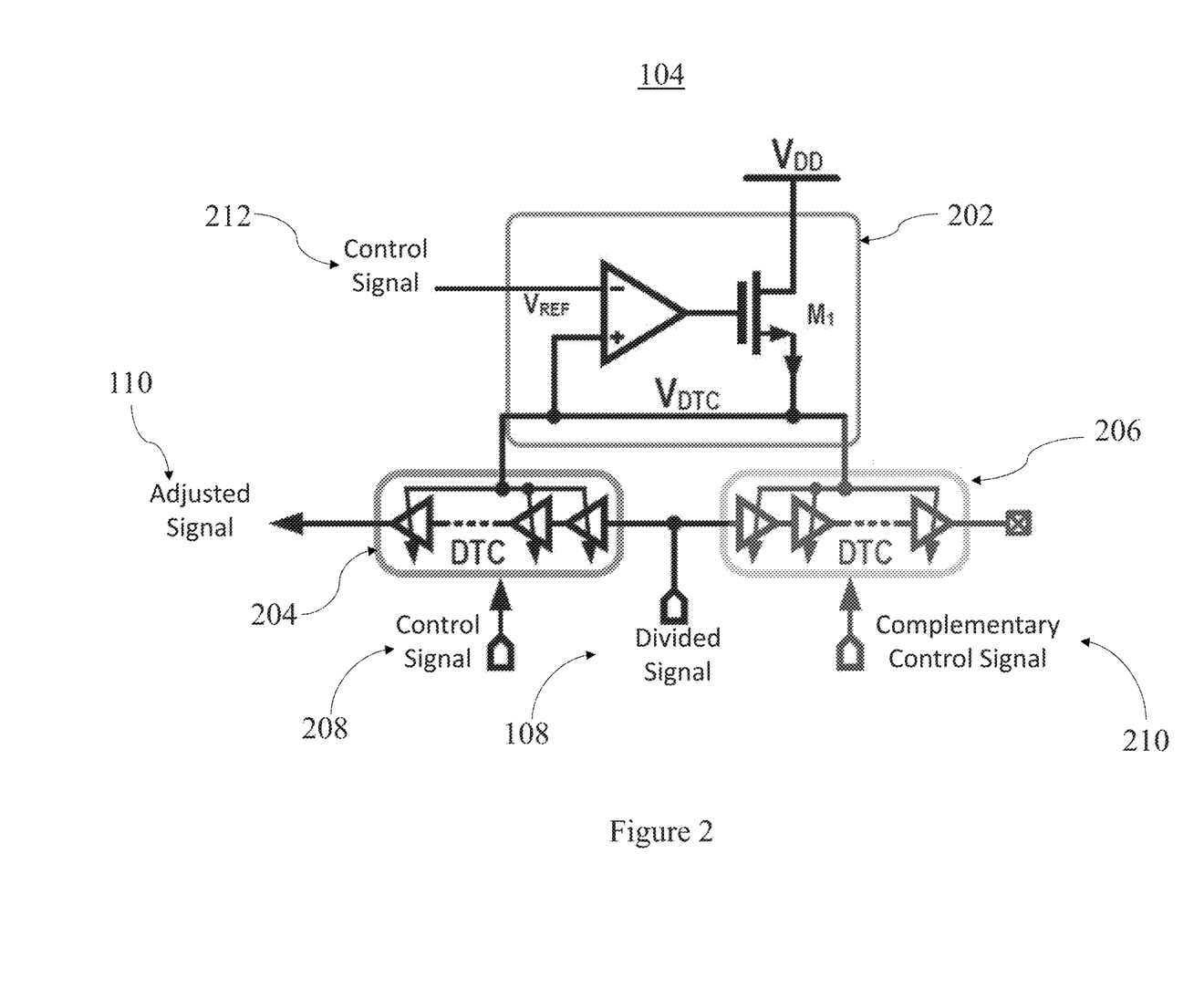
FIG. 2 illustrates an example digital-to-time converter (DTC) circuit in the circuit of FIG. 1.

FIG. 2 illustrates an example DTC circuit 104 in the circuit 100 of FIG. 1. As seen in FIG. 2, the DTC circuit 104 includes a regulator 202 and DTCs 204 and 206. In particular embodiments, the DTC circuit 104 adds delay to a divided signal 108 to produce an adjusted signal 110 while reducing jitter.

The regulator 202 supplies electrical power to the DTCs 204 and 206. As seen in FIG. 2, the regulator 202 includes various components (e.g., transistors and operational amplifiers) that deliver a controllable electric voltage or current to the DTCs 204 and 206. The regulator 202 may be connected with the DTCs 204 and 206. A power supply ($V_{DD}$) may be connected to the regulator 202 to supply electrical power. The regulator may adjust the electrical voltage or current from the power supply to produce an electrical voltage or current for the DTCs 204 and 206.

In particular embodiments, the regulator 202 receives a control signal 212. The control signal 212 may be a programmable digital or analog control signal that varies based on PVT variations in the DTC 204. By varying the control signal 212 based on PVT variations in the DTC 204, the DTC circuit 104 may effectively remove PVT variations from impacting the performance of the DTC circuit 104. In some embodiments, the digital control signal 212 may be first input into a digital-to-analog converter before being sent to the regulator 202. The regulator 202 adjusts the electrical power delivered to the DTC 204 based on the control signal 212.

The DTCs 204 and 206 are connected to the regulator 202 in parallel with one another. The regulator 202 supplies electrical current to each of the DTCs 204 and 206. Generally, the DTCs 204 and 206 operate in tandem such that their total current draw from the regulator 202 is substantially constant. In this manner, the DTC circuit 104 has a linearity performance that may be more resilient to PVT variations.

Generally, the DTCs 204 and 206 add delay to a divided signal 108. As discussed previously, the divided signal 108 may have been generated by the signal divider circuit 102. The signal divider circuit 102 may receive a signal 106 with a particular frequency. For example, the signal 106 may be a high frequency signal generated by an oscillator (e.g., a fixed frequency crystal reference oscillator or a phase-locked loop). The signal divider circuit 102 may adjust the frequency of the signal 106 by a fractional multiple to produce one or more divided signals 108. For example, the signal divider circuit 102 may generate a divided signal 108 that has a frequency that is a fractional multiple of the frequency of the signal 106. The signal divider circuit 102 may generate any suitable number of divided signals 108 of different frequencies.

The signal divider circuit 102 may generate a divided signal 108 of a particular frequency by performing any suitable operation on the signal 106. For example, the signal divider circuit 102 may contain circuitry that switches an output signal from low to high or high to low on rising edges of the signal 106 to generate a divided signal 108. As a result, the divided signal 108 has a frequency that is half of the frequency of the signal 106. As another example, the signal divider circuit 102 may switch the output signal from low to high or high to low after a variable number of rising edges of the signal 106 (e.g., switch on two rising edges then switch on a third rising edge for two periods) which averages over time to a divided signal 108 with a particular frequency that is a fractional multiple of the frequency of the signal 106. The variable number of rising edges may be adjusted in any suitable manner to generate a divided signal 108 of any desired frequency.

The DTC 204 adds delay to the divided signal 108 based on a control signal 208. The DTC 204 may include a sequence of delay stages that add delay to the divided signal 108. The amount of delay added to the divided signal 108 may be controlled by the control signal 208. After adding the delay to the divided signal 108, the DTC 204 produces adjusted signal 110. By adding delay to the divided signal 108, the DTC 204 may cancel some of the jitter in the divided signal 108. The control signal 208 may be divided by a controller in the DTC 204 into component signals that are used to control each delay stage.

Generally, each delay stage in the DTC 204 may include a comparator with capacitance non-linear gate capacitance. As discussed previously, the non-linear gate capacitance may cause the adjusted signal 110 to exhibit non-linear behavior, which increases the jitter in the adjusted signal 110. The DTC 204 includes an additional capacitor coupled between the comparator and ground, which reduces the impact of the comparator's non-linear gate capacitance. Thus, this capacitor reduces the INL of the DTC 204, which reduces the jitter in the adjusted signal 110 in particular embodiments. The DTC 204 will be described in more detail with respect to FIG. 3.

In particular embodiments, the DTC 204 improves the INL performance of the circuit 100 by 2.2×. This improvement in the INL performance reduces the amount of jitter in the adjusted signal 110.

The DTC 206 is connected in parallel with the DTC 204 to the regulator 202. The regulator 202 supplies an electrical current to the DTC 206. Similar to the DTC 204, the DTC 206 adds a delay to the divided signal 108 based on a control signal 210. The control signal 210 may be a complement to the control signal 208. Stated differently, the sum of the control signal 208 and the control signal 210 may be a constant. As the control signal 208 increases, the control signal 210 decreases. In this manner, the DTC 206 adds a delay to the divided signal 108 that varies inversely with the variations in the control signal 208. Because the control signal 208 and the control signal 210 sum to a constant, the total current load of the DTC 204 and the DTC 206 is held substantially constant. Stated differently, the regulator 202 produces a substantially constant current to power both the DTC 204 and the DTC 206 regardless of how the control signal 208 changes. In particular embodiments, because the total current load of the DTC 204 and the DTC 206 are held substantially constant, the DTC circuit 104 has a bandwidth and performance that are more resilient to PVT variations.

In some embodiments, the DTC 206 also improves the INL performance of the DTC circuit 104. Without the DTC 206 present in the DTC circuit 104, when the control signal 208 to the DTC 204 changes, the current consumption of the DTC circuit 104 also changes. This change in the current consumption of the DTC circuit 104 creates a ripple in the power supply voltage of the regulator 202, which changes the behavior of the DTC circuit 104 dynamically and degrades the INL performance. By adding the DTC 206 to the DTC circuit 104, the current consumption of the DTC circuit 104 is held constant regardless of variations in the control signal 208. As a result, the ripples in the power supply voltage are avoided, which improves the INL performance of the DTC circuit 104.

Figure 3:
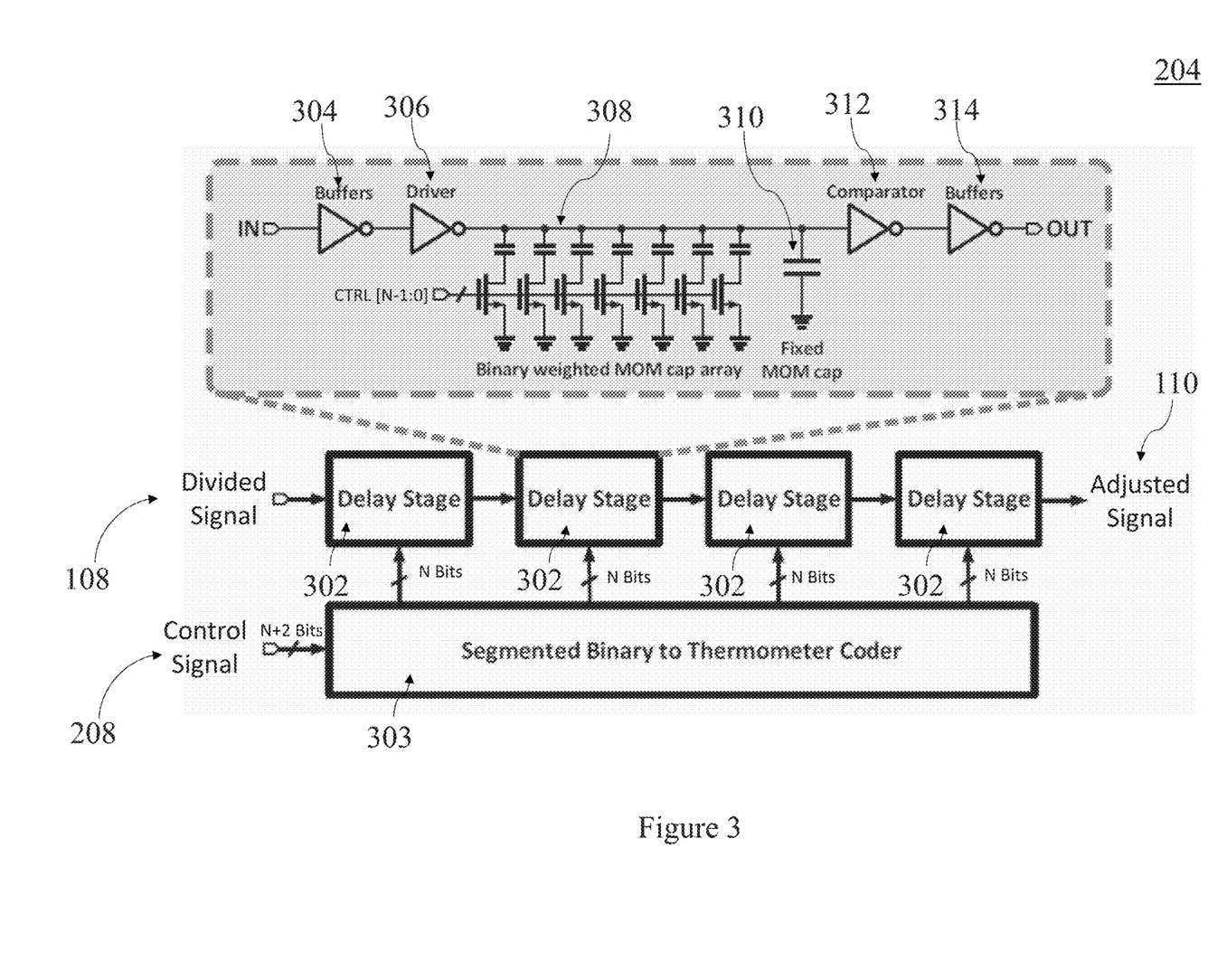
FIG. 3 illustrates an example DTC in the circuit of FIG. 1.

FIG. 3 illustrates an example DTC 204 in the circuit 100 of FIG. 1. As seen in FIG. 3, the DTC 204 includes a sequence of delay stages 302 that each add delay to the divided signal 108 to produce the adjusted signal 110. Generally, each delay stage 302 includes a capacitor that couples between ground and a comparator in the delay stage 302. In particular embodiments, this capacitor reduces the impact of the comparator's non-linear gate capacitance, which reduces the INL in the adjusted signal 110. The DTC 206 may include the same structures as the DTC 204 shown in FIG. 3.

The DTC 204 also includes a controller 303 that divides the control signal 208 into component signals that are used to control each delay stage 302. In the example of FIG. 3, the controller 303 divides a control signal 208 with N+2 bits into four signals with N bits that are sent to the delay stages 302. The controller 303 may include any suitable hardware, circuitry, or software for dividing the control signal 208. In particular embodiments, the controller 303 is a segmented thermometric controller or a segmented binary to thermometer coder. The DTC 204 may include any suitable number of delay stages 302. In particular embodiments, the controller 303 varies the programmable digital control signal 212 based on PVT variations in the DTC 204.

The DTC 204 receives the divided signal 108 from the signal divider circuit 102. As discussed above, the divided signal 108 may have been generated by the signal divider circuit 102. The signal divider circuit 102 may receive a signal 106 with a particular frequency. For example, the signal 106 may be a high frequency signal generated by an oscillator (e.g., a fixed frequency crystal reference oscillator, a phase-locked loop, an injection locked oscillator, or a multiplying delay locked loop). The signal divider circuit 102 may adjust the frequency of the signal 106 by a fractional multiple to produce one or more divided signals 108. For example, the signal divider circuit 102 may generate a divided signal 108 that has a frequency that is a fractional multiple of the frequency of the signal 106. The signal divider circuit 102 may generate any suitable number of divided signals 108 of different frequencies.

The signal divider circuit 102 may generate a divided signal 108 of a particular frequency by performing any suitable operation on the signal 106. For example, the signal divider circuit 102 may contain circuitry that switches an output signal from low to high or high to low on rising edges of the signal 106 to generate a divided signal 108. As a result, the divided signal 108 has a frequency that is half of the frequency of the signal 106. As another example, the signal divider circuit 102 may switch the output signal from low to high or high to low after a variable number of rising edges of the signal 106 (e.g., switch on two rising edges then switch on a third rising edge for two periods) which averages over time to a divided signal 108 with a particular frequency that is a fractional multiple of the frequency of the signal 106. The variable number of rising edges may be adjusted in any suitable manner to generate a divided signal 108 of any desired frequency.

The DTC 204 sends the divided signal 108 through the sequence of delay stages 302. The DTC 204 may include any suitable number of delay stages 302. Each delay stage 302 adds delay to the divided signal 108 (e.g., based on the control signal 208). The DTC 204 produces the adjusted signal 110 by sending the adjusted signal 108 through the sequence of delay stages 302. Adding delay to the divided signal 108 may cancel some of the jitter in the divided signal 108.

Each delay stage 302 includes components that add delay into the divided signal 108. As seen in FIG. 3, each delay stage includes buffers 304, a driver 306, an array 308 of capacitors, a capacitor 310, a comparator 312, and buffers 314. The buffers 304, the driver 306, the array 308 of capacitors, the comparator 312, and the buffers 314 operate together to add a controllable amount of delay to the divided signal 108 traveling through the delay stage 302. The buffers 304, driver 306, comparator 312, and buffers 314 are connected in series with one another. The buffer 304, driver 306, comparator 312, and buffers 314 may be any suitable complementary metal oxide semiconductor (CMOS) inverter structures. The array 308 includes parallel capacitors that are coupled to an input of the comparator 312. As seen in FIG. 3, the array 308 of capacitors include transistors that receive a control signal (e.g., CTRL[N−1:0]). By varying this control signal, the array 308 of capacitors contributes a varying amount of delay into the divided signal 108. This control signal may be the control signal 208.

As discussed previously, the comparator 312 includes non-linear gate capacitance that introduces INL into the divided signal 108 traveling through the comparator 312. The delay stage 302 includes a capacitor 310 coupled between an input of the comparator 312 and ground. The capacitor 310 may be any suitable type of capacitor. For example, the capacitor 310 may be a metal-oxide-metal capacitor, a metal-insulator-semiconductor capacitor, or a metal-insulator-metal capacitor. The capacitor 310 reduces the impact of the non-linear gate capacitance in the comparator 312. As a result, the DTC 204 does not introduce as much INL into the divided signal 108. Because this capacitor 310 is included in each delay stage 302, the DTC 204 adds delay to the divided signal 108 without substantially increasing the INL. As a result, the adjusted signal 110 exhibits less non-linear behavior which reduces the jitter within the adjusted signal 110 in certain embodiments.

In particular embodiments, the capacitor 310 is a fixed linear capacitor with a fixed capacitance across different voltages applied across the capacitor 310. The capacitor 310 has a capacitance that overwhelms the non-linear gate capacitance of the comparator 312. As a result, the capacitor 310 reduces the impact of the non-linear gate capacitance, which reduces the amount of INL in the adjusted signal 110.

In some embodiments, the capacitor 310 also improves the linearity of the regulator 202 or the array 308 of capacitors. By improving the linearity of these components, the capacitor 310 further reduces the INL in the adjusted signal 110, which further reduces the amount of jitter in the adjusted signal 110.

In some embodiments, the DTC circuit 104 improves the INL performance of the circuit 100 by 2.2×. This improvement in the INL performance reduces the amount of jitter in the adjusted signal 110.

Figure 4:
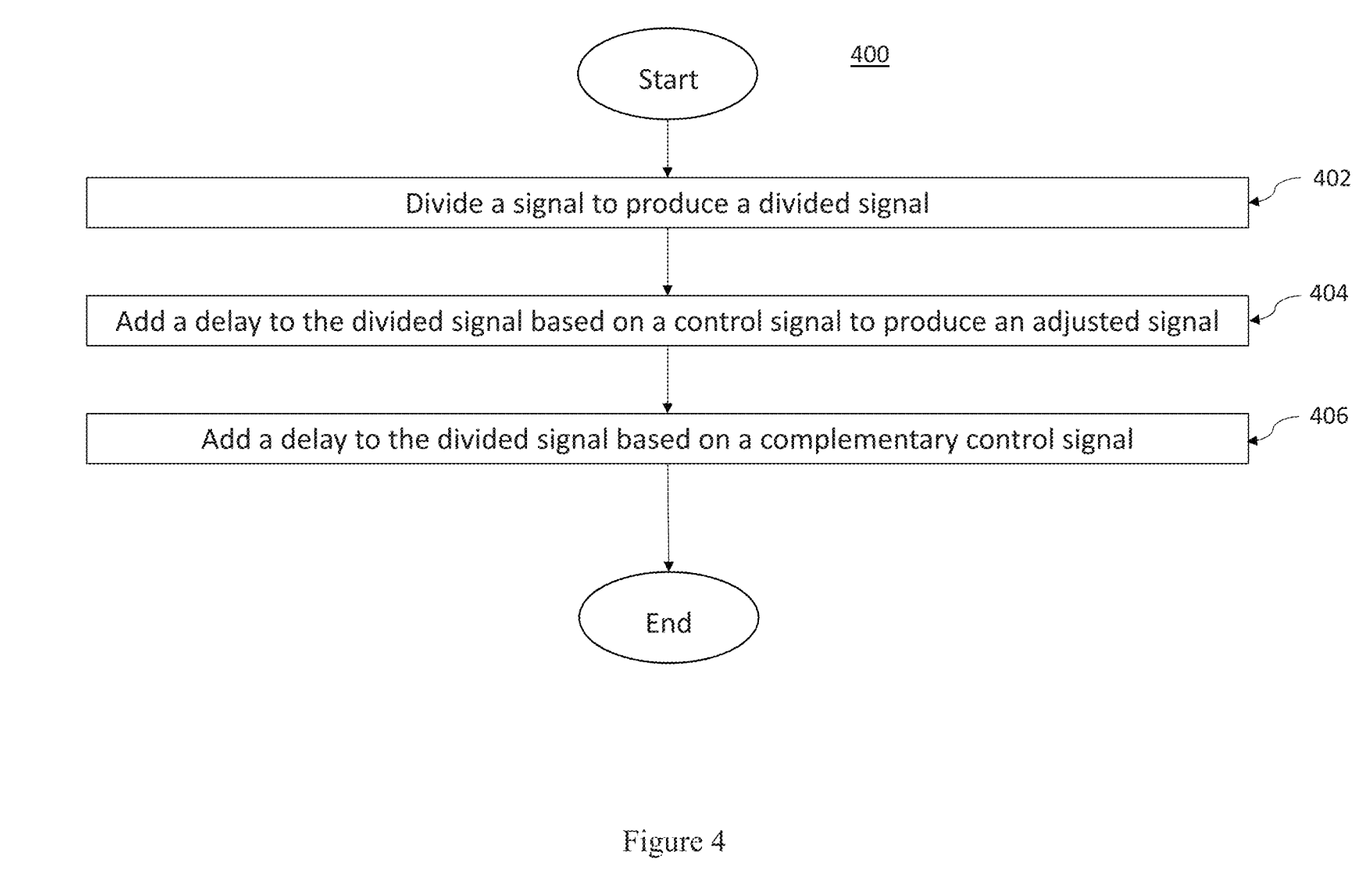
FIG. 4 is a flowchart of an example method in the circuit of FIG. 1.

FIG. 4 is a flowchart of an example method 400 in the circuit 100 of FIG. 1. Various components of the circuit 100 perform the steps of the method 400. In particular embodiments, by performing the method 400, the circuit 100 adjusts the frequency of a signal 106 while reducing the jitter in the signal 106.

In step 402, the signal divider circuit 102 divides a signal 106 to produce a divided signal 108. The signal 106 may have a particular frequency. For example, the signal 106 may be a high frequency signal generated by an oscillator (e.g., a fixed frequency crystal reference oscillator or a phase-locked loop). Generally, the signal divider circuit adjusts the frequency of the signal 106 by a fractional multiple to produce the divided signal 108. The divided signal 108 may have a reduced frequency relative to the signal 106. The signal divider circuit 102 may generate the divided signal 108 of a particular frequency by performing any suitable operation on the signal 106. For example, the signal divider circuit 102 may contain circuitry that switches an output signal from low to high or high to low on rising edges of the signal 106 to generate a divided signal 108. As a result, the divided signal 108 has a frequency that is half of the frequency of the signal 106. As another example, the signal divider circuit 102 may switch the output signal from low to high or high to low after a variable number of rising edges of the signal 106 (e.g., switch on two rising edges then switch on a third rising edge for two periods) to generate a divided signal 108 with any suitable frequency that is a fractional multiple of the frequency of the signal 106. The divided signal 108 may then be sent to the DTC circuit 104.

As discussed previously, when the signal divider circuit 102 adjusts the frequency of the signal 106 by a fractional multiple, the resulting divided signal 108 may include undesired jitter. This jitter may cause the frequency of the divided signal 108 to vary slightly over time. For example, certain portions of the divided signal 108 may have the desired frequency but many portions of the divided signal 108 may have a frequency that is less than or greater than the desired frequency as a result of the jitter.

In step 404, the DTC circuit 104 adds delay to the divided signal 108 to produce an adjusted signal 110. In particular embodiments, the DTC 204 of the DTC circuit 104 adds the delay to the divided signal 108 based on a control signal 208. The DTC 204 includes a sequence of delay stages 302 that add delays to the divided signal 108. Each delay stage 302 includes buffers 304, a driver 306, an array 308 of capacitors, a comparator 312, and buffers 314 that operate to add delay to the divided signal 108. The buffers 304, driver 306, comparator 312, and buffers 314 are coupled in series. The array 308 of capacitors are coupled to the input of the comparator 312.

As discussed previously, the comparator 312 includes a non-linear gate capacitance that causes the adjusted signal 110 to exhibit non-linear behavior, which increases jitter in the adjusted signal 110. The delay stages 302 include a capacitor 310 coupled between an input of the comparator 312 and ground. The capacitor 310 reduces the impact of the non-linear gate capacitance in the comparator 312. As a result, the DTC 204 may add delay to the divided signal 108 while not substantially increasing the INL in the divided signal 108. In this manner, the adjusted signal 110 does not exhibit as much non-linear behavior, which reduces the jitter in the adjusted signal 110 in particular embodiments.

In some embodiments, the capacitor 310 is a fixed linear capacitor with a fixed capacitance across different voltages applied across the capacitor 310. The capacitor 310 has a capacitance that overwhelms the non-linear gate capacitance of the comparator 312. As a result, the capacitor 310 reduces the impact of the non-linear gate capacitance, which reduces the amount of INL in the adjusted signal 110.

In certain embodiments, the capacitor 310 also improves the linearity of the regulator 202 or the array 308 of capacitors. By improving the linearity of these components, the capacitor 310 further reduces the INL in the adjusted signal 110, which further reduces the amount of jitter in the adjusted signal 110.

In step 406, the DTC circuit 104 adds delay to the divided signal 108. In particular embodiments, the DTC 206 of the DTC circuit 104 adds delay to the divided signal 108 based on a complementary control signal 210. As discussed previously, the control signal 210 may be a complement of the control signal 208. Stated differently, a sum of the control signal 208 and the complementary control signal 210 is constant. As the control signal 208 increases, the control signal 210 decreases. In this manner, the DTC 206 adds a delay to the divided signal 108 that varies inversely with the variations in the control signal 208. Because the control signal 208 and the control signal 210 sum to a constant, the total current load of the DTC 204 and the DTC 206 is held substantially constant. Stated differently, the regulator 202 produces a substantially constant current to power both the DTC 204 and the DTC 206 regardless of how the control signal 208 changes. In this manner, the total current load of the DTC 204 and the DTC 206 is held constant, which causes the bandwidth and performance of the DTC circuit 104 to be more resilient to PVT variations, in certain embodiments.

The regulator 202 supplies electrical power to the DTCs 204 and 206. The regulator 202 includes various components (e.g., transistors and operational amplifiers) that deliver a controllable electric voltage or current to the DTCs 204 and 206. The regulator 202 may be connected with the DTCs 204 and 206. A power supply ($V_{DD}$) may be connected to the regulator 202 to supply electrical power. The regulator may adjust the electrical voltage or current from the power supply to produce an electrical voltage or current for the DTCs 204 and 206.

In particular embodiments, the regulator 202 receives a control signal 212. The control signal 212 may be a programmable digital control signal that varies based on PVT variations in the DTC 204. By varying the control signal 212 based on PVT variations in the DTC 204, the DTC circuit 104 may further remove PVT variations from impacting the performance of the DTC circuit 104. In some embodiments, the digital control signal 212 may be first input into a digital-to-analog converter before being sent to the regulator 202.

The DTCs 204 and 206 are coupled to the regulator 202 in parallel with one another. The regulator 202 supplies electrical current to each of the DTCs 204 and 206. Generally, the DTCs 204 and 206 operate in tandem such that their total current draw from the regulator 202 is substantially constant. In this manner, the DTC circuit 104 has a bandwidth and performance that may be more resilient to PVT variations.

In some embodiments, the DTC 206 also improves the INL performance of the DTC circuit 104. Without the DTC 206 present in the DTC circuit 104, when the control signal 208 to the DTC 204 changes, the current consumption of the DTC circuit 104 also changes. This change in the current consumption of the DTC circuit 104 creates a ripple in the power supply voltage of the regulator 202, which changes the behavior of the DTC circuit 104 dynamically and degrades the INL performance. By adding the DTC 206 to the DTC circuit 104, the current consumption of the DTC circuit 104 is held constant regardless of variations in the control signal 208. As a result, the ripples in the power supply voltage are avoided, which improves the INL performance of the DTC circuit 104.

In summary, this disclosure describes a circuit 100 that can divide a high frequency signal into signals with lower frequencies while reducing jitter in the resulting signal. The high frequency signal may be generated using an oscillator (e.g., a fixed frequency crystal reference oscillator). The circuit 100 includes a signal divider circuit 102 that adjusts the frequency of the high frequency signal by a fractional multiple to produce one or more divided signals. For example, the signal divider circuit 102 may generate a divided signal that has a frequency that is lower than the frequency of the high frequency signal by a fractional multiple.

The signal divider circuit 102 may generate a divided signal of a particular frequency by performing any suitable operation on the high frequency signal. For example, the signal divider circuit 102 may contain circuitry that switches an output signal from low to high or high to low on rising edges of the high frequency signal to generate a divided signal. As a result, the divided signal has a frequency that is half of the frequency of the high frequency signal. As another example, the signal divider circuit 102 may switch the output signal from low to high or high to low after a variable number of rising edges of the high frequency signal (e.g., switch on two rising edges then switch on a third rising edge for two periods) which averages over time to a divided signal with a particular frequency. The variable number of rising edges may be adjusted in any suitable manner to generate a divided signal of any desired frequency.

When the signal divider circuit 102 adjusts the frequency of the high frequency signal by a fractional multiple, the resulting divided signal may include undesired jitter. For example, the signal divider circuit 102 may adjust the frequency of the high frequency signal by a fractional multiple and long-term averaging, but this process may introduce instantaneous frequency error. This frequency error may cause deterministic jitter in the divided signal. This jitter may cause the frequency of the divided signal to vary slightly over time. For example, certain portions of the divided signal may have the desired frequency but many portions of the divided signal may have a frequency that is less than or greater than the desired frequency as a result of the jitter.

The circuit includes a DTC circuit 104 that adds delay to the divided signal 108 to produce an adjusted signal. Generally, the DTC circuit 104 includes one or more enhancements that add delay to the divided signal while reducing jitter. For example, the DTC circuit 104 may include a DTC 204 that includes a capacitor 310 coupled between ground and a comparator 312 in each delay stage 302 of the DTC 204. This capacitor 310 may reduce the impact of the comparators 312 non-linear gate capacitance, which improves the INL of the DTC circuit 104 in certain embodiments. As a result, the DTC 204 adds delay into a divided signal while improving INL, which reduces jitter in the resulting adjusted signal.

In particular embodiments, the DTC circuit 104 improves the INL performance of the circuit 100 by 2.2×. This improvement in the INL performance reduces the amount of jitter in the adjusted signal.

As another example, the DTC circuit 104 includes a second DTC 206 that is controlled based on the complement of a control signal used to control the first DTC 204. The two DTCs 204 and 206 are connected in parallel. As a result, the total current load of the two DTCs 204 and 206 is held substantially constant. Additionally, the DTC circuit 104 may be controlled by a digital control signal that varies based on process, voltage, and temperature (PVT) variations in the first DTC. As a result of the total current load being held substantially constant and the digital control signal, the DTC circuit 104 has a bandwidth and performance that are more resilient to PVT variations, in certain embodiments. The DTC circuit 104 thus adds delay to the divided signal 108 to produce an adjusted signal 110 while reducing jitter in the divided signal 108.

In some embodiments, the second DTC 206 also improves the INL performance of the circuit 100. Without the second DTC 206 present in the circuit 100, when the control signal to the DTC circuit 104 changes, the current consumption of the DTC circuit 104 also changes. This change in the current consumption of the DTC circuit 104 creates a ripple in the power supply voltage, which changes the behavior of the DTC circuit 104 dynamically and degrades the INL performance. By adding the second DTC 206 to the DTC circuit 104, the current consumption of the DTC circuit 104 is held constant regardless of variations in the control signal. As a result, the ripples in the power supply voltage are avoided, which improves the INL performance of the DTC circuit 104.

In this manner, the circuit 100 can divide a high frequency signal into one or more lower frequency signals while reducing jitter in the lower frequency signals. Specifically, the circuit 100 includes a DTC 204 that adds delay into a divided signal to counter the jitter introduced when dividing the high frequency signal. The DTC 204 includes a capacitor 310 that improves the INL of the circuit 100, which further reduces the jitter introduced with the additional delay. Additionally, the circuit 100 includes a DTC 206 that is controlled with a control signal that is the complement of the control signal used to control the DTC 204. As a result, the total current load of the DTCs 204 and 206 is held constant, which further improves INL and reduces jitter. Moreover, the circuit 100 includes a regulator 202 that is controlled by a control signal that varies based on PVT variations in the DTC 204, which further improves INL and reduces jitter.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

In view of the foregoing, the scope of the present disclosure is determined by the claims that follow.

We claim:

1. An apparatus comprising:
    a first digital-to-time converter comprising a sequence of delay stages, each of the delay stages configured to add a first delay to an input signal based on a control signal, wherein each of the delay stages comprises a comparator and a capacitor coupled to an input of the comparator and to ground; and
    a second digital-to-time converter connected in parallel to the first digital-to-time converter, the second digital-to-time converter configured to add a second delay to the input signal based on a complement of the control signal while the first digital-to-time converter adds the first delay to the input signal based on the control signal.

2. The apparatus of claim 1, wherein the capacitor has a fixed capacitance.

3. The apparatus of claim 1, wherein the capacitor is a metal-oxide-metal capacitor, a metal-insulator-semiconductor capacitor, or a metal-insulator-metal capacitor.

4. The apparatus of claim 1, further comprising a regulator coupled to the first and second digital-to-time converters.

5. The apparatus of claim 4, wherein the regulator adjusts an electrical power delivered to the first digital-to-time converter based on a programmable digital control signal that varies based on a process, voltage, and temperature variation of the first digital-to-time converter.

6. The apparatus of claim 1, wherein each of the delay stages further comprises an array of capacitors coupled to the input of the comparator.

7. The apparatus of claim 1, further comprising a divider circuit configured to divide a clock signal to produce the input signal.

8. A method comprising:
    adding, by a sequence of delay stages of a first digital-to-time converter and based on a control signal, a first delay to an input signal, wherein each of the delay stages comprises a comparator and a capacitor coupled to an input of the comparator and to ground; and
    adding, by a second digital-to-time converter connected in parallel to the first digital-to-time converter, a second delay to the input signal based on a complement of the control signal while the first digital-to-time converter adds the first delay to the input signal based on the control signal.

9. The method of claim 8, wherein the capacitor has a fixed capacitance.

10. The method of claim 8, wherein the capacitor is a metal-oxide-metal capacitor, a metal-insulator-semiconductor capacitor, or a metal-insulator-metal capacitor.

11. The method of claim 8, wherein a regulator is coupled to the first and second digital-to-time converters.

12. The method of claim 11, further comprising adjusting, by the regulator, an electrical power delivered to the first digital-to-time converter based on a programmable digital control signal that varies based on a process, voltage, and temperature variation of the first digital-to-time converter.

13. The method of claim 8, wherein each of the delay stages further comprises an array of capacitors coupled to the input of the comparator.

14. The method of claim 8, further comprising dividing, by a divider circuit, a clock signal to produce the input signal.

15. A system comprising:
    a divider circuit configured to divide a clock signal to produce an input signal;
    a first digital-to-time converter comprising a sequence of delay stages, each delay stage of the sequence of delay stages configured to add a first delay to the input signal based on a control signal, wherein each delay stage comprises a comparator and a capacitor configured to mitigate integral non-linearity (INL) introduced by the comparator; and
    a second digital-to-time converter connected in parallel to the first digital-to-time converter, the second digital-to-time converter configured to add a second delay to the input signal based on a complement of the control signal while the first digital-to-time converter adds the first delay to the input signal based on the control signal.

16. The system of claim 15, wherein the capacitor has a fixed capacitance.

17. The system of claim 15, wherein the capacitor is a metal-oxide-metal capacitor, a metal-insulator-semiconductor capacitor, or a metal-insulator-metal capacitor.

18. The system of claim 15, further comprising a regulator coupled to the first and second digital-to-time converters.

19. The system of claim 18, wherein the regulator adjusts an electrical power delivered to the first digital-to-time converter based on a programmable digital control signal that varies based on a process, voltage, and temperature variation of the first digital-to-time converter.

20. The system of claim 15, wherein each of the delay stages further comprises an array of capacitors coupled to the input of the comparator.

* * * * *